US008618518B2

(12) United States Patent
Niles et al.

(10) Patent No.: US 8,618,518 B2
(45) Date of Patent: Dec. 31, 2013

(54) APPARATUS AND METHOD FOR FORMING A SOLID IMMERSION LENS USING A BINARY BITMAP MILLING PATTERN

(75) Inventors: David Winslow Niles, Fort Collins, CO (US); Ronald William Kee, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 7 days.

(21) Appl. No.: 13/048,429

(22) Filed: Mar. 15, 2011

(65) Prior Publication Data

US 2012/0235057 A1    Sep. 20, 2012

(51) Int. Cl.
*G21K 5/10*    (2006.01)

(52) U.S. Cl.
USPC .................. 250/492.3; 250/492.1; 250/492.2; 250/492.21

(58) Field of Classification Search
None
See application file for complete search history.

(56) References Cited

U.S. PATENT DOCUMENTS

| | | | |
|---|---|---|---|
| 5,315,119 A * | 5/1994 | Komatsu et al. | 250/398 |
| 5,818,217 A * | 10/1998 | Komatsu et al. | 324/754.22 |
| 6,441,359 B1 * | 8/2002 | Cozier et al. | 250/216 |
| 6,809,886 B2 | 10/2004 | Hsu et al. | |
| 6,952,014 B1 * | 10/2005 | Street | 850/43 |
| 7,115,426 B2 * | 10/2006 | Le Roy et al. | 438/16 |
| 7,161,736 B2 | 1/2007 | Legrand et al. | |
| 2005/0076322 A1 * | 4/2005 | Ye et al. | 716/20 |
| 2005/0121610 A1 * | 6/2005 | Abe | 250/310 |
| 2005/0232120 A1 * | 10/2005 | Shinoda | 369/112.23 |
| 2005/0285054 A1 * | 12/2005 | Inoue et al. | 250/492.22 |
| 2006/0030064 A1 * | 2/2006 | Roy et al. | 438/24 |
| 2006/0078637 A1 * | 4/2006 | Goruganthu et al. | 425/174.4 |
| 2007/0042496 A1 * | 2/2007 | Okamoto et al. | 436/86 |
| 2009/0325325 A1 * | 12/2009 | Patterson | 438/15 |
| 2010/0200770 A1 | 8/2010 | Brun et al. | |

FOREIGN PATENT DOCUMENTS

JP    08250496 A    *    9/1996    .......... H01L 21/3205

OTHER PUBLICATIONS

L. Marseglia et al., Nano-fabricated solid immersion lenses registered to single emitters in diamond; arXiv:1012.1135v2[quant-ph]; pp. 1-4; Dec. 9, 2010.

* cited by examiner

*Primary Examiner* — Andrew Smyth (57) ABSTRACT

A method for forming a solid immersion lens (SIL) includes generating a focused ion beam, and projecting the focused ion beam onto an optical medium at locations defined by a binary bitmap milling pattern, wherein the locations at which the focused ion beam impact a surface of the optical medium are randomized over successive raster scans of the surface of the optical medium to form at least a portion of a hemispherical structure in the optical medium.

20 Claims, 8 Drawing Sheets

APPARATUS AND METHOD FOR FORMING A SOLID IMMERSION LENS USING A BINARY BITMAP MILLING PATTERN

BACKGROUND

A solid immersion lens (SIL) is a refractive or diffractive, optical element that can be formed on or otherwise affixed to a substrate. Typically, a SIL is part of an objective lens that is brought into adjacent contact with the optical medium through which it is desirable to view an embedded object. A refractive SIL increases the magnification and the resolution of an object buried in the optical medium by modifying refraction as the light passes from the optical medium into air. SILs are becoming commercially available on advanced imaging systems capable of observing buried features with light that penetrates or emits from the medium. A flip-chip application specific integrated circuit (ASIC) fabricated on silicon (Si) is an exemplary candidate for a SIL since light longer than the wavelength of the optical band gap of silicon can easily transmit through the backside silicon of the flip-chip, reflecting off the circuitry beneath to provide an image of the circuitry for diagnostic purposes.

Figure 1A:
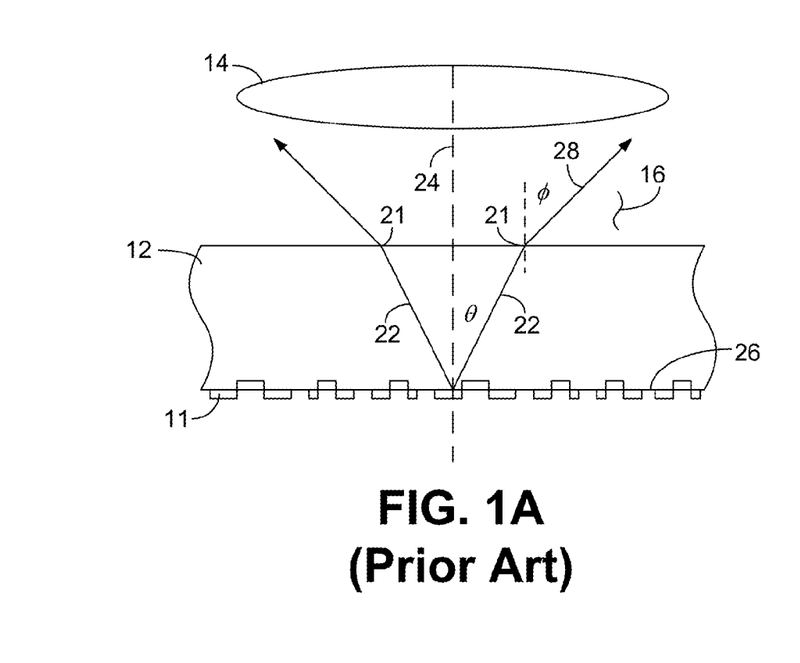
FIGS. 1A and 1B are prior art schematic diagrams illustrating the effect of a SIL when viewing circuitry through an optical medium, such as silicon (Si).
Figure 1B:
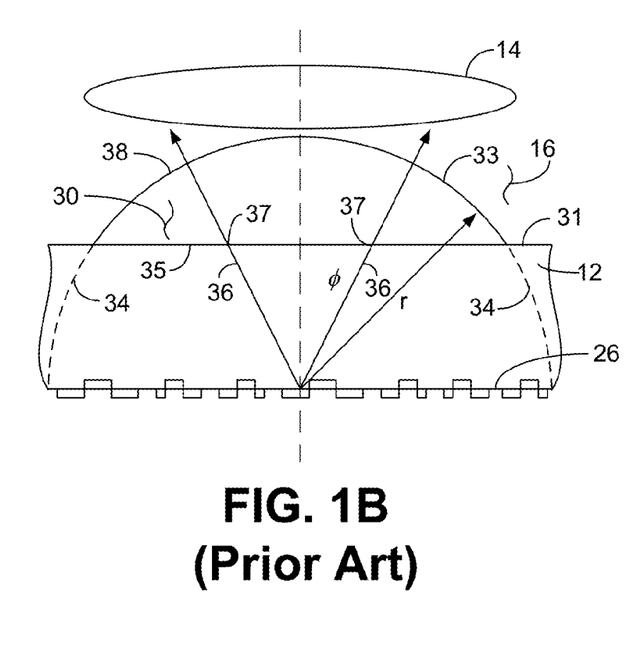

FIGS. 1A and 1B are prior art schematic diagrams illustrating the effect of a refractive SIL when viewing circuitry through an optical medium, such as silicon (Si). FIG. 1A shows circuitry 11 formed in silicon 12, which is referred to as "backside silicon" because it extends generally away from the plane on which the circuitry 11 is located. FIG. 1A shows the optical path used to view circuitry 11 on a flip-chip ASIC without a SIL. Light of wavelength longer than the energy band gap of silicon passes through the backside Si 12 and then continues to an objective lens of a microscope, also referred to as a "backing objective" 14. Without a SIL, light refracts as it crosses the boundary between the backside Si 12 and the air 16. This boundary point is shown using reference numeral 21. Light passing through the backside Si 12, shown as light ray 22, forms an angle "θ" with respect to an optical axis 24, which extends normal to the plane 26 on which the circuitry 11 is located. As the light refracts at the boundary point 21, light ray 28 forms an angle "φ" with respect to the optical axis 24, where the angle "θ" is less than the angle "φ" according to Snell's law.

FIG. 1B illustrates a sectional prior art illustration of a SIL 30. The SIL 30 is a section of a sphere made from Si and held in intimate contact with the surface 31 of the backside Si 12. In this example, the radius "r" of the SIL 30 is 1.5 mm, and the thickness of the backside Si is approximately 780 μm. The exposed portion 33 of the SIL 30 and the backside Si enclosed in the dashed arc 34 forms a hemisphere. With this geometry, the plane 26 of the circuitry 11 bisects a sphere where the Si hemisphere that forms the SIL 30 is used to direct the light. All light from the center of the sphere crosses the boundary 35 between the backside Si 12 and the SIL 30 without refraction if the SIL 30 and the backside Si 12 are in adjacent contact. Light passing through the backside Si 12, shown as light ray 36, forms an angle "φ" with respect to the optical axis 24. When a SIL 30 is implemented, all light 36 from the center of the sphere crosses the boundary 35 between the backside Si 12 and the SIL 30 without refraction, as shown at points 37, and maintains the constant angle "φ" with respect to the optical axis 24. The light rays 36 then cross the boundary 38 between the SIL 30 and air 16 normal to the boundary 38, exiting the SIL 30 without refraction.

The increase in the effective numerical aperture (NA, defined as sin(θ) in FIG. 1A and sin(φ) in FIG. 1B) for the SIL 30 is a key to the improvement in resolution when viewing the circuitry 11. The resolution of the optical system defined by FIG. 1A is the Raleigh condition:

$$R = \lambda_{Si}/(2 \ast NA_\theta),$$

where $\lambda_{Si}$ and $NA_\theta$ are the wavelength and numerical aperture of the light in the Si, respectively. Relative to their values in air, the wavelength of light in Si is $\lambda/n$ where n=3.5 is the index of refraction of Si near-IR wavelengths (1.1 μm to 1.7 μm), and NA is governed by Snell's law $n \ast \sin(\theta) = \sin(\phi)$ with φ being the angle of the light after refraction.

In FIG. 1B the surface of the Si is reshaped to be hemispherical to prevent refraction. Since all light rays in FIG. 1B strike the Si/air surface perpendicularly, refraction vanishes and the resolution becomes:

$$R_{SIL} = \lambda_{Si}/(2 \ast NA_\phi),$$

where Snell's law no longer affects NA. The net effect of the hemispherical surface is to improve the resolution defined by the Raleigh condition according to the relationship:

$$R_{SIL} = R/n,$$

and to improve the magnification by a factor of n.

The configuration of the SIL 30 is called a centric SIL because the object (portions of the circuitry 11 that are at a focal area of the SIL 30) is physically at the center of the hemisphere. In practice, the SIL 30 does not require the exact geometry shown because the backing objective 14 can move in the vertical dimension to compensate although the resolution and magnification will be affected.

Figure 2:
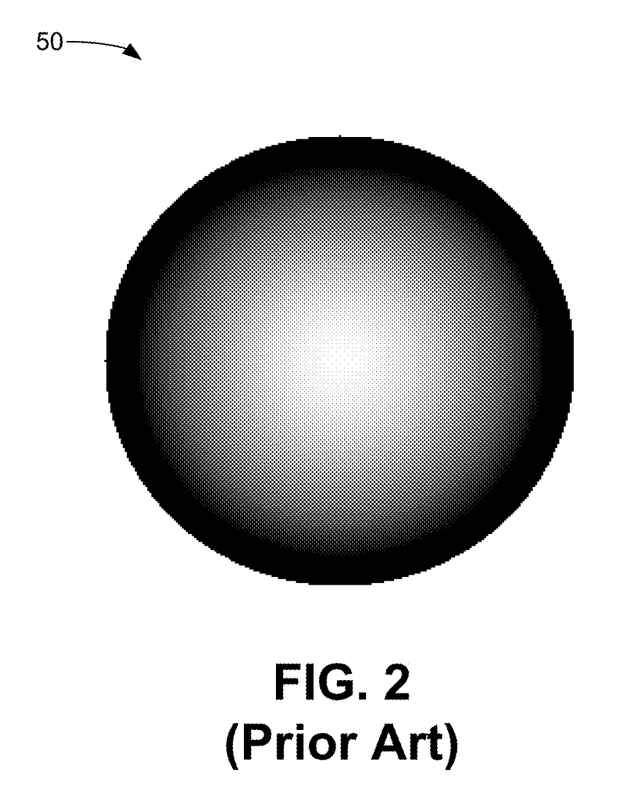
FIG. 2 is a diagram illustrating a gray-scale rendering that can be used to create a milling pattern to form the SIL of FIG. 1B.

A SIL is commercially available as a separate structure, or can be commercially formed on a surface of an optical medium using a focused ion beam (FIB) projected through a gray scale rendering of a milling pattern. A focused ion beam (FIB) uses a beam of $Ga^+$ ions to strike and mechanically erode a surface of an optical medium. The length of time the $Ga^+$ beam dwells at a point determines the depth of the mill. A prior technique can be used to form a hemispherical surface in an optical medium by projecting the hemispherical shape into a two-dimensional gray scale image where darker gray scale levels correspond to deeper milling. The gray scale then determines the dwell time, i.e. the length of time the FIB mills at each point. FIG. 2 is a diagram illustrating a two-dimensional gray-scale rendering 50 of a three-dimensional hemisphere. The two-dimensional gray-scale rendering 50 can be used to create a milling pattern to form the SIL 30. Such a SIL is formed as a hemispherical structure directly on the optical medium.

Unfortunately, many FIB milling tools cannot use a two-dimensional gray-scale rendering to control the milling performed by the FIB. Therefore, it would be desirable to have an alternative way of forming a high quality SIL on an optical medium.

SUMMARY

In an embodiment, a method for forming a solid immersion lens (SIL) includes generating a focused ion beam, and projecting the focused ion beam onto an optical medium at locations defined by a binary bitmap milling pattern, wherein the locations at which the focused ion beam impact a surface of the optical medium are randomized over successive raster scans of the surface of the optical medium to form at least a portion of a hemispherical structure in the optical medium.

Other embodiments are also provided. Other systems, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of the apparatus and method for forming a solid immersion lens (SIL) using a binary bitmap milling pattern are implemented by a focused ion beam (FIB) milling apparatus to create hemispherical surfaces on the backside Si of an application specific integrated circuit (ASIC) and other circuit structures. For example, in an integrated circuit architecture that employs a "flip chip" architecture it is desirable to be able to visually inspect at least portions of the active circuitry through the bulk silicon.

Figure 3:
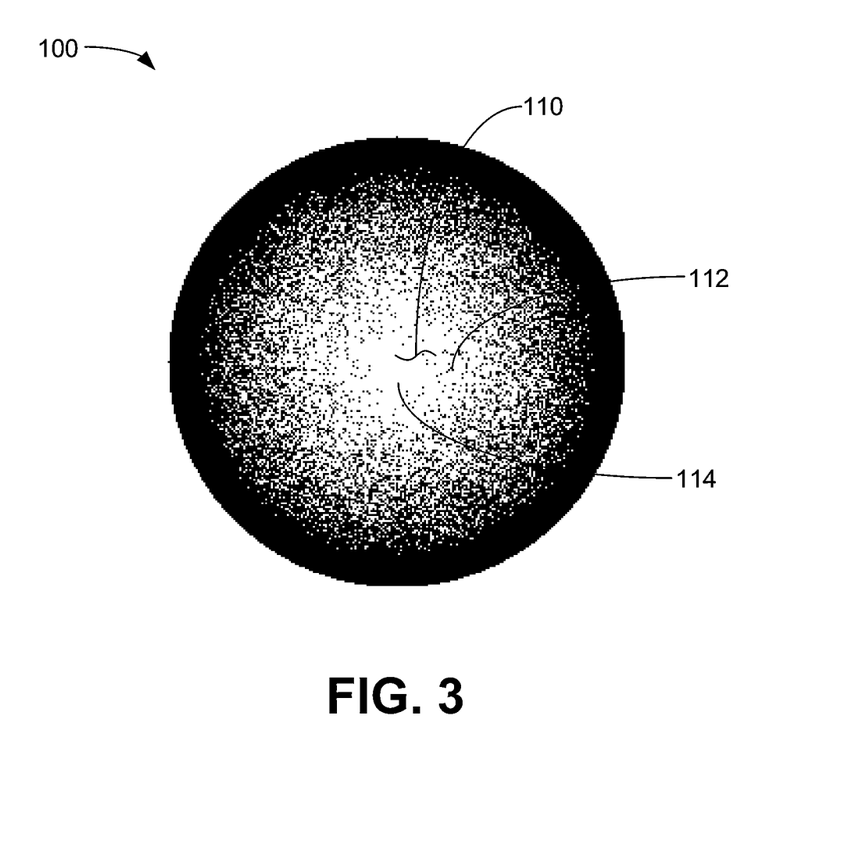
FIG. 3 is a diagram illustrating a binary bitmap rendering of a gray-scale image.

FIG. 3 is a diagram illustrating a binary bitmap rendering of a gray-scale image. The binary (i.e., black and white) bitmap rendering 100 can be generated by interpreting a gray-scale as a probability that a pixel should be black or white. On a gray scale of 0 to 255, for example, a level of 200 could mean a probability of 200/255=0.784 that the pixel should be white. The binary bitmap rendering 100 illustrates a field 110 of pixels that can be set either to black or white. An exemplary black pixel is illustrated at 112 and an exemplary white pixel is illustrated at 114. A black pixel indicates a location where the $Ga^+$ beam would impact and abrade the surface of the backside Si and a white pixel indicates a location where the $Ga^+$ beam would not impact or abrade the surface of the backside Si. The number of pixels in the bitmap is determined by the geometry and milling parameters of the FIB milling apparatus. In a typical embodiment, the bitmap is approximately 100×100 to 300×300 pixels. The pattern can be used to define a hemispherical structure formed in the backside Si. In this manner, the binary bitmap rendering 100 is created and can be used to control the beam of an FIB milling machine.

When converting a high-resolution image (for example, a gray-scale image) to a low-resolution image (for example, a binary bitmap rendering) a loss of information may occur due to a condition known as aliasing. Aliasing can result in a jaggedness appearing on the surface of a SIL created using the binary bitmap rendering 100. There are a number of antialiasing techniques that can be implemented to reduce the jaggedness of the surface of the SIL and result in a smooth surface.

In addition to the binary bitmap rendering 100, and to create a hemispherical structure having a smooth surface having a high optical quality, in an embodiment, it is desirable to be able to rotate the rastering axes of the $Ga^+$ beam during the milling process relative to the surface of the backside Si. The rastering axes of the $Ga^+$ beam can be rotated while the Si can be held stationary, the Si can be rotated while the rastering pattern of the $Ga^+$ beam is held stationary, or both the rastering axes of the $Ga^+$ beam and the Si can be rotated relative to each other to create relative rotational movement between the $Ga^+$ beam and the Si. Creating relative rotation between the rastering axes of the $Ga^+$ beam and the Si randomizes the dwell time of the $Ga^+$ beam on the surface of the backside Si according to the binary bitmap rendering 100, thereby antialiasing the binary bitmap and providing a uniformly smooth surface having a high optical quality.

An alternative technique for randomizing the milling imparted to the surface of the backside Si is to vary the distribution, sequence, or arrangement, of black and white pixels in the binary bitmap rendering 100 to create one or more successive binary bitmap renderings that functionally represents the original gray-scale image, but that have a different distribution of black and white pixels than does the original binary bitmap rendering, so long as the distribution of black and white pixels still provides the desired hemispherical surface. A number of different binary bitmap renderings 100 can be created and used in successive milling operations to randomize the milling imparted to the surface of the backside Si without using relative rotational movement between the $Ga^+$ beam and the surface of the backside Si. Repeatedly milling the surface of the backside Si using a number of different successive binary bitmap milling patterns randomizes the dwell time of the $Ga^+$ beam on the surface of the backside Si, thereby providing a uniformly smooth surface having a high optical quality. In an embodiment, 0-255 gray levels can be collapsed down to 2 levels. Therefore, 256/2=128 binary bitmaps will regain any information lost due to aliasing. That is, 128 binary bitmap renderings are the maximum needed. If the $Ga^+$ beam is defocused so that it covers 3×3=9 pixels at a time, 128/9=14 binary bitmap renderings can be used to make a reasonably smooth surface. In such an embodiment, fourteen unique binary bitmap renderings can be successively applied during the milling process to create a smooth, hemispherical surface.

Figure 4A:
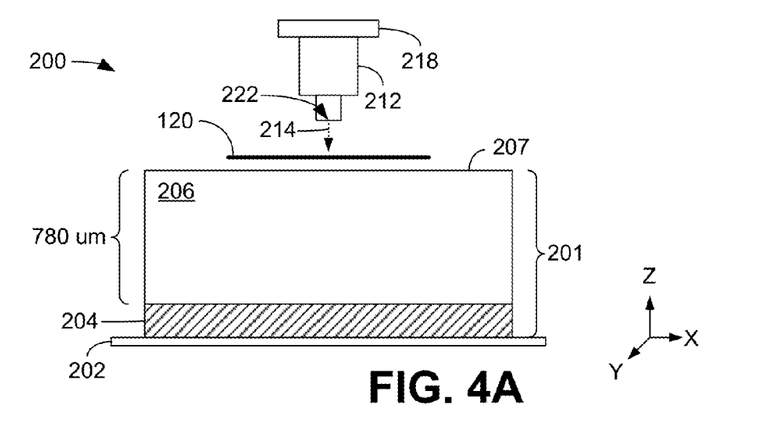
FIGS. 4A through 4C collectively illustrate a system that can use the binary bitmap rendering of FIG. 3 and method described above to form a hemispherical structure in an optical medium.
Figure 4B:
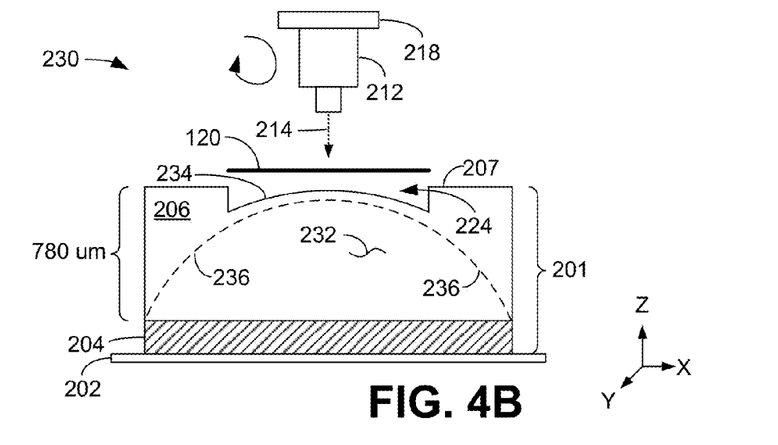
Figure 4C:
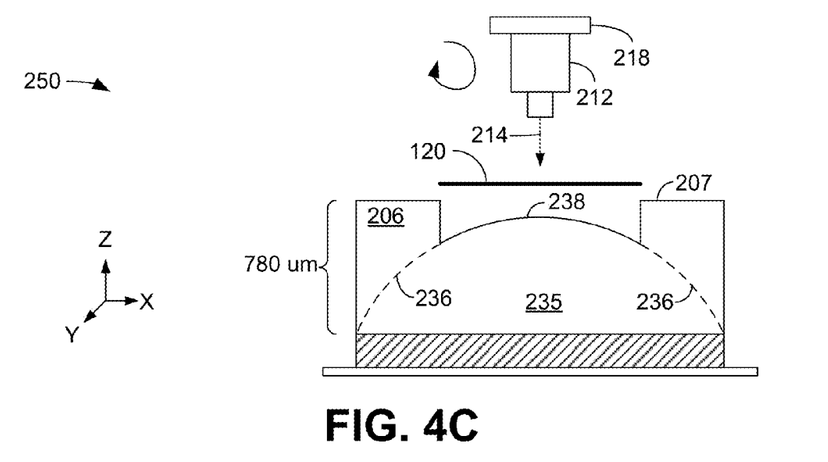

FIGS. 4A through 4C collectively illustrate an apparatus that can use the binary bitmap rendering 100 of FIG. 3 and method described above to form a hemispherical structure in an optical medium. As mentioned above a focused ion beam (FIB) can be used to perform milling on an optical medium, such as, but not limited to, bulk silicon. In an embodiment, a typical FIB uses a liquid metal ion source (LMIS) to produce a beam of $Ga^+$ ions that is focused by a column of ion optics onto a sample surface. The ion optical column shapes the beam in magnitude (e.g., several picoamperes (pA) to many nanoamperes (nA)), voltage (e.g., tens of kilovolts (kV)), and size (e.g., several nanometers (nm) to several micrometers (μm)), and has steering plates (not shown) at the exit of the milling head that can move the nominal center of the beam to a new spot on the sample, raster the beam in a boustrophedonic pattern over an area (ranging from approximately one square micrometer (μm²) to approximately one square millimeter (mm²) to produce an image of the surface, and rotate the boustrophedon to any pair of orthogonal axes in the X-Y plane. As used herein, the term "boustrophedon" refers to a pattern of producing lines of Ga⁺ beam that alternate from left to right and from right to left. In a typical application, the thickness of the bulk silicon substrate is between approximately 40 μm and 780 μm. In an embodiment, it may be desirable to mechanically or chemically thin the backside Si to a thickness thinner that 780 μm prior to milling. For example, it may be desirable to thin the backside Si to a thickness of approximately 40 to 120 μm to facilitate the production of an effective SIL quickly since milling large patterns can take several hours with existing equipment.

The apparatus 200 includes a circuit device 201 on which it is desired to form a hemispherical structure, which can be used as a SIL. The circuit device 201 includes active circuit portion 204 and bulk silicon 206. The bulk Si 206 is also referred to as the backside Si. In an embodiment, the bulk silicon 206 is approximately 780 μm thick. The active circuit portion 204 includes circuitry, the visual inspection of which is desirable through the bulk Si 206. The circuit device 201 is located on a movable surface 202 within a FIB chamber (not shown for simplicity). In an embodiment, the movable surface 202 can be part of a table, or other type of support structure or platform, the location of which can be precisely controlled in three dimensions, typically in the X, Y and Z dimensions; and in rotation about the X, Y and Z axes.

The apparatus 200 also includes a milling head 212 that produces a focused ion beam 214. The milling head 212 is part of a milling apparatus that generates, focuses and controls the power of the focused ion beam, as known in the art. The milling head 212 is positioned above the surface 207 of the bulk silicon 206 so that the focused ion beam 214 can be directed to specific areas of the surface 207 of the bulk silicon 206 to mechanically erode selected portions of the surface 207 to form a hemispherical structure. The milling head 212 includes a support structure 218 which fixes it in space. The movable surface 202 allows the sample to be placed under the milling head 212, and the steering elements (not shown) of the ion column allow rotation of the boustrophedonic raster pattern around the Z axis. The milling head 212 also includes an opening 222, which allows the focused ion beam 214 to exit the milling head 212 and to image and mechanically erode the bulk silicon 206.

In an embodiment, the focused ion beam can be a Ga⁺ beam generated by using a liquid metal ion source (LMIS). However, other materials can be used to generate other types of focused ion beams. In an embodiment, the focused ion beam can have a current of approximately 4.4 nanoamperes (nA) and a physical size of approximately 0.03 to 10 micrometers (μm) at the focus. The focused ion beam can raster over the surface 207 in a boustrophedon to encompass an area of approximately 10,000 μm² for a 100×100 pixel array where each pixel is 1 μm². The focused ion beam can dwell at a given point for approximately 0.5 μs, can step approximately 0.3 μm to 1 μm to the next dwell point, and can then repeat. The milling head 212 directs the focused ion beam 214 onto the surface 207 through a binary bitmap milling pattern 120.

The movable surface 202 holding the circuit device 201 can be controlled so that the circuit device 201 can be precisely located in three dimensions about the X, Y and Z axes relative to the milling head 212. Rotating the axes of the boustrophedonic rastering pattern of the focused ion beam 214 about the Z axis causes the binary bitmap milling pattern 120 to rotate about its center over the surface 207 of the bulk silicon 206, thereby providing cylindrical symmetry to the erosion rate of the Ga⁺ beam about the Z axis on the surface 207 of the bulk Si 206, and thereby provide a cylindrically uniform, smooth erosion pattern. The binary bitmap milling pattern 120 follows the rastering axes. For example, at a beginning time, t=0, the X axis of the sample (the circuit device 201) is parallel to the X axis of the motor drive (not shown) of the movable surface 202 and the Y axis of the sample (the circuit device 201) is parallel to the Y axis of the motor drive (not shown) of the movable surface 202. The Z axis is vertical. The rastering axes are parallel to the X and Y axes described. With rotation on, the rastering axes can be rotated relative to the stationary X and Y axes of the movable surface 202. The X axis on the display (642, FIG. 6) is horizontal and the Y axis is vertical. If the rotation of the Ga⁺ beam is 1 Hz, then 0.25 seconds later the x axis used to define the rastering pattern on the surface 207 of the circuit device 201 is along a diagonal relative to the X and Y axes of the motor drives of the movable surface 202, and the Y axis is still perpendicular to the X axis. The milling system draws the image on the display with the X axis being horizontal and the Y axis being vertical. The net effect is that the image on the display appears to rotate as if the surface 207 of the circuit device 201 had actually rotated while the Ga⁺ beam remained constant. The sample remains stationary, but the rastering axes of the Ga⁺ beam have rotated by 45 degrees, making it appear that the binary bitmap milling pattern 120 also rotated accordingly. The rotation is an electronic means of simulating rotation of the movable surface 202. At the dimensions described herein, true mechanical motion would result in a surface having a significant amount of error. Therefore, the rotation feature smoothly simulates rotation of the circuit device 201 about the Z axis.

The software that controls the FIB milling apparatus either directs the Ga⁺ beam to the sample surface, or deflects the Ga⁺ beam out of the column where it strikes a plate. The Ga⁺ beam rasters a boustrophedon with the binary bitmap milling pattern 120 superimposed. If a pixel is black, the beam passes through to the bulk Si 206. If the pixel is white, the beam is deflected away from the bulk Si 206 into a plate within the column. The gray-scale image is rendered to a binary bitmap, and the binary bitmap controls whether the beam exits the milling head 212 (black) and impacts the surface 207, or strikes the plate within milling head 212 (white) and does not impact the surface 207.

The focused ion beam 214 mechanically erodes the surface 207 at the locations defined by the black pixels (FIG. 3) on the binary bitmap rendering 100, resulting in a section of a hemispherical structure being formed in the bulk Si 206.

FIG. 4B is a schematic diagram illustrating an apparatus 230 in which the bulk Si 206 has been eroded to partially expose a portion 234 of a hemisphere 232. The application of the Ga⁺ focused ion beam 214 through the binary bitmap milling pattern 120 results in a cavity 224 being formed (i.e., milled) into the bulk silicon 206 in accordance with the milling process described above. In accordance with an embodiment of the apparatus and method for forming a solid immersion lens (SIL) using a binary bitmap milling pattern, the focused ion beam 214 is applied to the surface 207 through the binary bitmap milling pattern 120 for a predetermined period of time. In an embodiment, the milling process can be applied for approximately one hour with the focused ion beam current at approximately 4.4 nA. However, this predetermined time and beam energy can vary substantially and is dependent upon the dimensions of the structure sought to be formed and other factors.

The cavity 224 formed (i.e., milled) into the bulk silicon 206 exposes a sector 234 of the hemisphere 232. The exposed sector 234 and the backside Si enclosed in the dashed arc 236 forms the hemisphere 232.

FIG. 4C is a schematic diagram illustrating an apparatus 250 in which the bulk Si 206 has been eroded to expose a sector 238 of the hemisphere 232. The exposed sector 238 and the portion of the backside Si defined by the dashed arc 236 forms a SIL 235.

Figure 5:
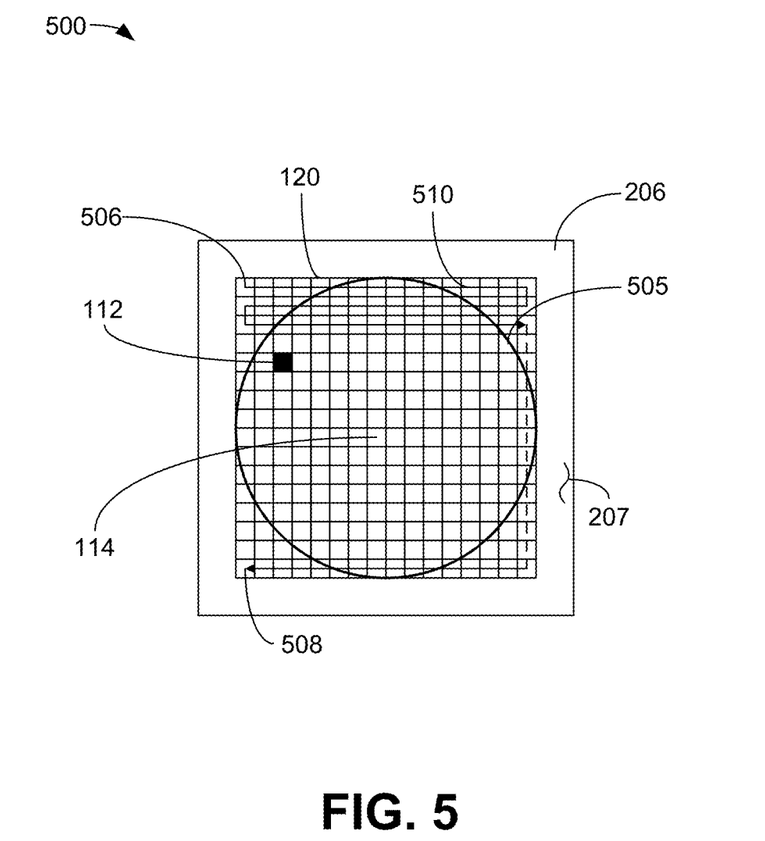
FIG. 5 is a plan view illustrating an exemplary binary bitmap milling pattern.

FIG. 5 is a plan view illustrating an exemplary binary bitmap milling pattern. The binary bitmap milling pattern 120 is shown in plan view superimposed over the surface 207 of the bulk Si 206. The outer diameter of the SIL 235 (FIG. 4C) is illustrated using reference numeral 505. The binary bitmap milling pattern 120 is divided into square regions 505, each region 505 depicting a pixel in a 16×16 array of pixels. A 16×16 array is shown for simplicity of illustration. In practice, a larger array of between 100×100 and 300×300 pixels is typically used. An example of the milling process begins at an exemplary pixel 506 and progresses in a boustrophedon along the direction indicated by the arrow 510 until reaching an exemplary ending pixel 508. To achieve the boustrophedon illustrated by the arrow 510, the Ga$^+$ beam is electronically steered along the path indicated by the arrow 510 so that the beam impacts the surface 207 in locations where a black pixel is present and is prevented from impacting the surface 207 where a white pixel is present. In this manner, a hemispherical shape is formed on the surface 207.

In an embodiment, one progression of the Ga$^+$ beam across all of the pixels in the binary bitmap milling pattern 120 is completed in approximately 50 milliseconds (ms). During the progression, the rastering axes of the projected Ga$^+$ beam are rotated at a rate of approximately 0.5 Hz while the process repeats. Rotating the rastering axes of the Ga$^+$ beam for each pixel over the surface 207 of the bulk Si 206 randomizes the dwell time of the Ga$^+$ beam on the surface of the backside Si according to the binary bitmap rendering 100, thereby providing a uniformly smooth surface having a high optical quality. In alternative embodiments, the Ga$^+$ beam can be defocused to encompass more than a single pixel to facilitate antialiasing.

In an alternative embodiment, the movable surface 202 can be rotated about the Z axis by a table drive element 602 (FIG. 6) to create relative movement between the Ga$^+$ beam and the surface 207 of the bulk Si 206, while the rastering axes of the Ga$^+$ beam remains stationary relative to the Z axis.

In another alternative embodiment, a number of different, but functionally equivalent, binary bitmap milling patterns 120 can be created and used for each progression of the Ga$^+$ beam along the path indicated by the arrow 510 without creating relative rotation between the Ga$^+$ beam and the surface 207 of the bulk Si 206. In this embodiment, each successive and randomly created binary bitmap milling pattern 120 will likely have different white and black pixels, while the overall distribution of white and black pixels still creates the hemispherical surface described above. In this manner over successive milling iterations using different binary bitmap milling patterns, the locations where the Ga$^+$ beam impacts the surface 207 is sufficiently randomized to create the hemispherical shape described above having a smooth surface having high optical quality.

Figure 6:
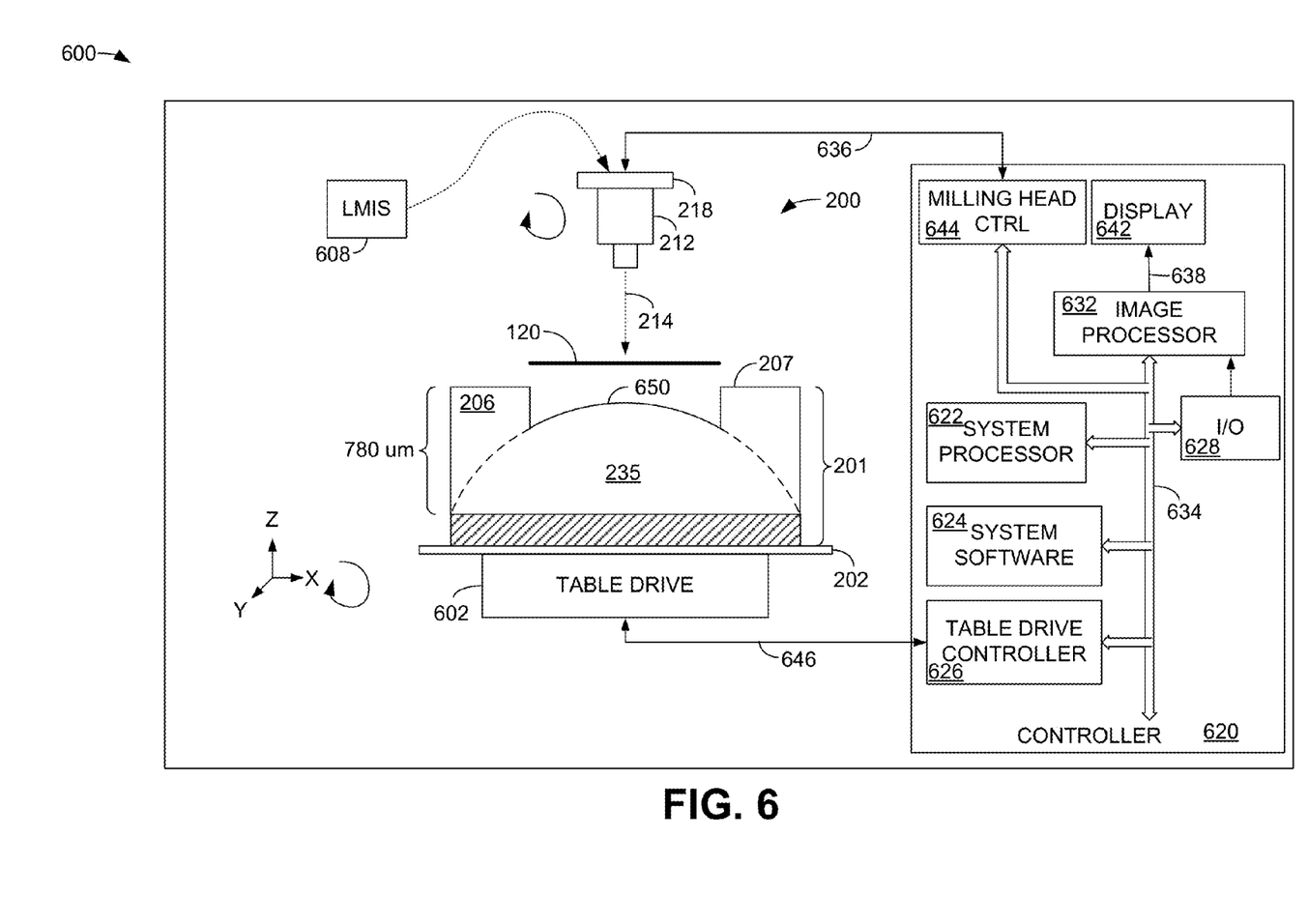
FIG. 6 is a block diagram illustrating an embodiment of a system for forming a solid immersion lens (SIL) using a binary bitmap milling pattern.

FIG. 6 is a block diagram illustrating an embodiment of an apparatus 600 for forming a solid immersion lens (SIL) using a binary bitmap milling pattern. The apparatus 600 includes the apparatus portion 200 adapted to receive a liquid metal ion source (LMIS) 608, from which a focused ion beam 214 is generated and directed by the milling head 212.

As shown in FIG. 6, the substrate on which the SIL is made is located on a table drive element 602. The table drive element 602 is controlled by a controller 620 and allows controllable movement in a horizontal plane defined by the X and Y directions and in a vertical plane defined by the Z direction. The table drive element 602 is used to center the desired portion of the circuit device 201 under the focused ion beam 214. The milling head 212 is positionally fixed and incapable of movement. Rotation of the binary bitmap milling pattern 120 is controlled by the steering elements (not shown) of the ion beam column. In an embodiment, the focused ion beam 214 makes one complete pass of the bitmap in approximately <100 ms, and the raster pattern makes one complete revolution relative to the surface in about 2 s. Therefore, the focused ion beam 214 makes 20 complete passes of the binary bitmap milling pattern 120 in one complete revolution of the focused ion beam 214. Alternatively, it is possible for the table drive element 602 to rotate eucentrically about the Z axis to rotate the bulk Si 206 about the axis (for example, the Z axis) of the focused ion beam 214, and thereby realize the equalization of the impact of the focused ion beam 214 on the surface 207 according to the binary bitmap milling pattern 120. As used herein, the term "eucentrically rotate" refers to ability to define a point as the center of rotation. To illustrate, assume a motor rotates the movable surface 202 (FIG. 4B) about a center on the Z axis located at x=0, y=0. Now assume that it is desired to rotate the movable surface 202 about a center at a location x=1, y=1. The system software 624 rotates the movable surface 202 and simultaneously translates the movable surface 202 in the X and Y dimensions to keep the point x=1, y=1 from moving relative to the Z axis.

The controller 620 includes a system processor 622, system software 624, a table drive controller 626, an input/output (I/O) element 628, an image processor 632, and a milling head controller 644 coupled together over a system bus 634. The system bus 634 can be any communication bus that allows bi-directional communication between and among the connected elements. The controller 620 also includes a display 642.

The system processor 622 can be any general-purpose or special-purpose processor or microprocessor that is used to control the operation of the system 600. The software 624 can contain executable instructions in the form of application software, execution software, embedded software, or any other software that controls the operation of the controller 620 and the elements in the system 600.

The table drive controller 626 is operatively coupled to the table drive element 602 over connection 646. The milling head controller 644 is operatively coupled to the support structure 218 over connection 636. In accordance with an embodiment of the system for forming a solid immersion lens (SIL) using a binary bitmap milling pattern, the table drive controller 626 is used to control the relative position of the focused ion beam 214 and the surface 207 of the bulk Si 206, so that the circuit device 201 can be moved in a plane, defined in the X and Y directions.

Figure 7:
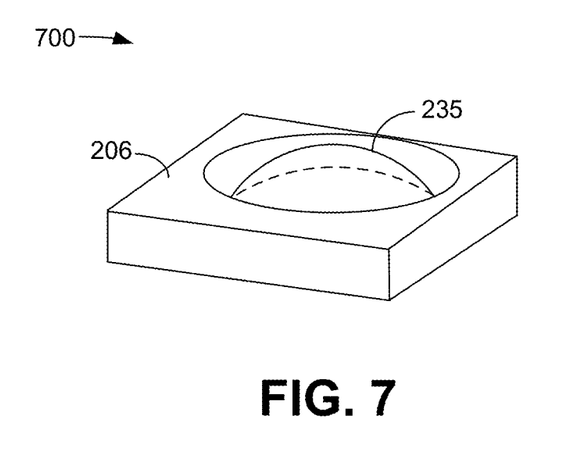
FIG. 7 is a perspective view of an optical medium including a SIL formed thereon.

FIG. 7 is a perspective view of an optical medium 700 including a SIL formed thereon. The optical medium 700 can be, for example, a portion of bulk Si 206 as described above. A SIL 235 is formed in the bulk Si 206 using the apparatus and method for forming a solid immersion lens (SIL) using a binary bitmap milling pattern, as described herein.

Figure 8:
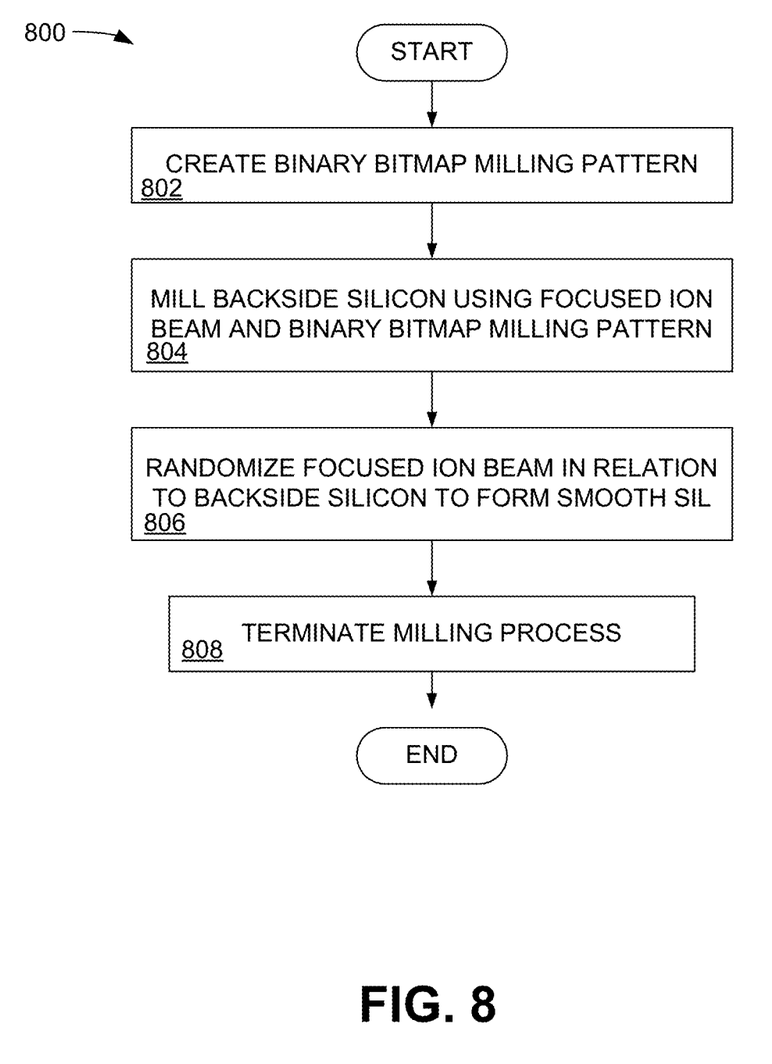
FIG. 8 is a flowchart illustrating the operation of an embodiment of a method for forming a solid immersion lens (SIL) using a binary bitmap milling pattern.

FIG. 8 is a flowchart 800 illustrating the operation of an embodiment of a method for forming a solid immersion lens (SIL) using a binary bitmap milling pattern. The blocks in the flow chart 800 can be performed in or out of the order shown. In addition, at least some of the steps can be performed in parallel. In block 802 a binary bitmap milling pattern 120 is created using the binary bitmap rendering 100 of FIG. 3.

In block 804, the bulk Si 206 is milled using a focused ion beam and the binary bitmap milling pattern created in block 802. In block 806, the point at which the focused ion beam impacts the surface of the backside Si for each pixel in the binary bitmap milling pattern is randomized for successive scans. In an embodiment, the rastering axes of the focused ion beam are rotated over the surface of the bulk Si to form a SIL having a smooth surface of high optical quality. In another embodiment, the bulk Si is rotated while the rastering pattern of the focused ion beam remains stationary. In yet another embodiment, a number of different, but functionally equivalent, binary bitmap milling patterns 120 are created and sequentially used in sequential raster scan milling operations to form a SIL having a smooth surface of high optical quality. In block 808, the milling process is terminated and the process ends.

This disclosure describes the invention in detail using illustrative embodiments. However, it is to be understood that the invention defined by the appended claims is not limited to the precise embodiments described.

What is claimed is:

1. An apparatus for forming a solid immersion lens (SIL) in an optical medium, comprising:
    a milling head configured to generate a focused ion beam; and
    a binary bitmap milling pattern defining locations at which the focused ion beam is projected onto a surface of the optical medium, wherein the locations at which the focused ion beam impact the surface of the optical medium are located completely within the binary bitmap milling pattern and are randomized over successive raster scans of the surface of the optical medium, wherein the binary bitmap milling pattern comprises a plurality of pixels, a first portion of the pixels defining locations where the focused ion beam impacts the surface of the optical medium and a second portion of the pixels defining locations where the focused ion beam is prevented from impacting the surface of the optical medium, each successive raster scan comprising a subsequent binary bitmap milling pattern having a different distribution of pixels that impact the surface of the optical medium and that are prevented from impacting the surface of the optical medium than a previous binary bitmap milling pattern, each different distribution of pixels comprising a functionally equivalent binary bitmap milling pattern.

2. The apparatus of claim 1, wherein the successive raster scans comprise electronically rotating rastering axes of the focused ion beam relative to the surface of the optical medium for each successive raster scan.

3. The apparatus of claim 1, wherein the successive raster scans comprise rotating the surface of the optical medium relative to the rastering axes of the focused ion beam for each successive raster scan.

4. The apparatus of claim 1, wherein the subsequent binary bitmap milling pattern randomizes a dwell time of the focused ion beam.

5. The apparatus of claim 4, wherein the focused ion beam covers an area of 3 pixels by 3 pixels and 14 binary bitmap milling patterns create the SIL.

6. The apparatus of claim 5, wherein the SIL is created on a backside of the optical medium.

7. A method for forming a solid immersion lens (SIL), comprising:
    generating a focused ion beam;
    projecting the focused ion beam onto an optical medium at locations defined by a binary bitmap milling pattern, wherein the locations at which the focused ion beam impact a surface of the optical medium are located completely within the binary bitmap milling pattern and are randomized over successive raster scans of the surface of the optical medium to form at least a portion of a hemispherical structure in the optical medium; and
    using the binary bitmap milling pattern to define first locations where the focused ion beam impacts a surface of the optical medium and to define second locations where the focused ion beam is prevented from impacting the surface of the optical medium, each successive raster scan comprising a subsequent binary bitmap milling pattern having a different distribution of pixels that impact the surface of the optical medium and that are prevented from impacting the surface of the optical medium than a previous binary bitmap milling pattern, each different distribution of pixels comprising a functionally equivalent binary bitmap milling pattern.

8. The method of claim 7, further comprising electronically rotating the rastering axes of the focused ion beam relative to the surface of the optical medium for each successive raster scan.

9. The method of claim 7, further comprising rotating the surface of the optical medium relative to the rastering axes of the focused ion beam for each successive raster scan.

10. The method of claim 7, wherein the subsequent binary bitmap milling pattern randomizes a dwell time of the focused ion beam.

11. The method of claim 10, wherein the focused ion beam covers an area of 3 pixels by 3 pixels and 14 binary bitmap milling patterns create the SIL.

12. The method of claim 11, wherein the SIL is created on a backside of the optical medium.

13. An apparatus for forming a solid immersion lens (SIL) in bulk silicon, comprising:
    a milling head configured to generate a focused ion beam; and
    a binary bitmap milling pattern defining locations at which the focused ion beam is projected onto a surface of the bulk silicon, wherein the locations at which the focused ion beam impact the surface of the bulk silicon are located completely within the binary bitmap milling pattern and are randomized over successive raster scans of the surface of the bulk silicon by relative rotation between the rastering axes of the focused ion beam and the surface of the bulk silicon, the relative rotation occurring as the focused ion beam follows a boustrophedon pattern.

14. The apparatus of claim 13, further comprising using the binary bitmap milling pattern to define first locations where the focused ion beam impacts a surface of the bulk silicon and to define second locations where the focused ion beam is prevented from impacting the surface of the bulk silicon.

15. The apparatus of claim 13, wherein the successive raster scans comprise electronically rotating the focused ion beam relative to the surface of the optical medium.

16. The apparatus of claim 13, wherein the successive raster scans comprise eucentrically rotating the surface of the optical medium relative to an axis along which the focused ion beam is projected.

17. The apparatus of claim 14, wherein each successive raster scan comprises a binary bitmap milling pattern having a different distribution of pixels that impact the surface of the bulk silicon and that are prevented from impacting the surface of the bulk silicon than a previous binary bitmap milling pattern, each different distribution of pixels comprising a functionally equivalent binary bitmap milling pattern.

18. The apparatus of claim 17, wherein the binary bitmap milling pattern randomizes a dwell time of the focused ion beam.

19. The apparatus of claim 18, wherein the focused ion beam covers an area of 3 pixels by 3 pixels and 14 binary bitmap milling patterns.

20. The apparatus of claim 19, wherein the SIL is created on a backside of the bulk silicon.

* * * * *